United States Patent
Fujita et al.

(10) Patent No.: US 8,488,735 B2
(45) Date of Patent: Jul. 16, 2013

(54) SOLID-STATE IMAGER AND X-RAY CT APPARATUS INCLUDING SAME

(75) Inventors: Kazuki Fujita, Hamamatsu (JP); Harumichi Mori, Hamamatsu (JP); Ryuji Kyushima, Hamamatsu (JP); Masahiko Honda, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 160 days.

(21) Appl. No.: 12/864,575

(22) PCT Filed: Jan. 23, 2009

(86) PCT No.: PCT/JP2009/051105
§ 371 (c)(1),
(2), (4) Date: Oct. 19, 2010

(87) PCT Pub. No.: WO2009/096338
PCT Pub. Date: Aug. 6, 2009

(65) Prior Publication Data
US 2011/0019795 A1    Jan. 27, 2011

(30) Foreign Application Priority Data
Jan. 30, 2008  (JP) ................ P2008-019345

(51) Int. Cl.
*A61B 6/00*         (2006.01)
(52) U.S. Cl.
USPC ........................................... 378/19; 378/98.8
(58) Field of Classification Search
USPC .................... 378/19, 98.8; 250/208.1
See application file for complete search history.

(56) References Cited

U.S. PATENT DOCUMENTS

| | | | |
|---|---|---|---|
| 2005/0082630 A1* | 4/2005 | Yamanaka | ............ 257/461 |
| 2005/0178971 A1 | 8/2005 | Hoge | |
| 2005/0179053 A1 | 8/2005 | Ezaki et al. | |

FOREIGN PATENT DOCUMENTS

| | | |
|---|---|---|
| EP | 1677353 | 7/2006 |
| EP | 2092563 | 8/2009 |
| JP | 57-109476 | 7/1982 |
| JP | 3-148869 | 6/1991 |
| JP | H5-251684 | 9/1993 |
| JP | 11289100 | 10/1999 |
| JP | 2001-27673 | 1/2001 |
| JP | 2002-43555 | 2/2002 |
| JP | 2002-176163 | 6/2002 |
| JP | 2005-21661 | 1/2005 |
| JP | 2006-173488 | 6/2006 |
| JP | 2006-234557 | 9/2006 |
| JP | 2007-267995 | 10/2007 |
| WO | 2005/038923 | 4/2005 |
| WO | WO-2008/075577 | 6/2008 |

* cited by examiner

*Primary Examiner* — Jurie Yun
(74) *Attorney, Agent, or Firm* — Drinker Biddle & Reath LLP

(57) ABSTRACT

The present invention relates to a solid-state imaging device and the like having a structure for capturing a high-resolution image even when any of the reading-out wiring and row selecting wiring is disconnected. A pixel portion $P_{m,n}$ of the photodetecting section (10) includes a photodiode PD generating charge of an amount according to an incident light intensity and a reading-out switch $SW_1$ connected to the photodiode PD. The pixel portion $P_{m,n}$ occupies a substantially square region, and most of the region is a region of the photodiode PD. A field-effect transistor serving as the reading-out switch $SW_1$ is formed in one corner of the region. A channel stopper CS is continuously formed in a region sandwiched by pixel portions. In a region surrounded by any 2×2 pixel portions adjacent to one another, a dummy photodiode PD1 surrounded by the channel stopper CS is formed.

3 Claims, 8 Drawing Sheets

SOLID-STATE IMAGER AND X-RAY CT APPARATUS INCLUDING SAME

TECHNICAL FIELD

The present invention relates to a solid-state imaging device with a plurality of photodetecting sections arranged two-dimensionally, and an X-ray CT apparatus including the same.

BACKGROUND ART

As a solid-state imaging device, those using the CMOS technique are known, and among these, a passive pixel sensor (PPS) type solid-state imaging device is known (see Patent Document 1). The PPS type solid-state imaging device has a structure where PPS type pixel portions including photodiodes for generating charges of amounts according to incident light intensities are two-dimensionally arrayed in M rows and N columns. In each pixel portion, charges generated in the photodiode in response to light incidence are accumulated in a capacitive element of an integrating circuit, and a voltage value according to the accumulated charge amount is outputted.

In general, an output terminal of each of the M pixel portions belonging to each column is connected to an input terminal of an integrating circuit provided corresponding to the column via a reading-out wiring provided corresponding to the column. And, in order from the first row to the M-th row, a charge generated in the photodiode of the pixel portion is inputted to a corresponding integrating circuit through a corresponding reading-out wiring, and a voltage value according to the charge amount is outputted from the integrating circuit.

Moreover, each of the N pixel portions belonging to each row is connected to a controlling section via a row selecting wiring provided corresponding to the row. In accordance with a row selecting controlling signal transmitted from the controlling section via the row selecting wiring, each pixel portion outputs a charge generated in the photodiode to the reading-out wiring.

The PPS type solid-state imaging device is used for various purposes. For example, the PPS type solid-state imaging device is used in combination with a scintillator panel as an X-ray flat panel also for medical purposes and industrial purposes. Further, the PPS type solid-state imaging device is also used, specifically, in an X-ray CT apparatus, a microfocus X-ray inspection system, etc. The solid-state imaging device to be used for these purposes has a large-area photodetecting section in which M×N pixel portions are two-dimensionally arrayed, and the photodetecting section may be integrated on a semiconductor substrate having a size with sides more than 10 centimeters in length. Therefore, only one solid-state imaging device may be produced from one semiconductor wafer.

Patent Document 1: Japanese Laid-Open Patent Application No. 2006-234557

DISCLOSURE OF THE INVENTION

Problems that the Invention is to Solve

The present inventors have examined the conventional solid-state imaging device, and as a result, have discovered the following problems. That is, in the conventional solid-state imaging device, when a reading-out wiring corresponding to any one of the columns is disconnected during production, pixel portions located closer to the integrating circuit than the disconnected point among the M pixel portions belonging to the column are connected to the integrating circuit by the reading-out wiring, while pixel portions located farther from the integrating circuit than the disconnected point are not connected to the integrating circuit.

More specifically, in the conventional solid-state imaging device, charges generated in photodiodes in response to light incidence in the pixel portions located farther from the integrating circuit than the disconnected point are not reading-out to the integrating circuit, and are just accumulated in junction capacitance portions of the photodiodes.

Likewise, when a row selecting wiring corresponding to any one of the rows is disconnected during production, pixel portions located closer to a row selecting section than the disconnected point among the N pixel portions belonging to the row are connected to the row selecting section via the row selecting wiring, while pixel portions located farther from the row selecting section than the disconnected point are not connected to the row selecting section. At this time, charges generated in photodiodes in response to light incidence in the pixel portions located farther from the row selecting section than the disconnected point are not reading-out to the integrating circuit, and are just accumulated in junction capacitance portions of the photodiodes. When the amount of charges accumulated in the junction capacitance portions of the photodiodes exceeds a saturation level, a surplus of charges over the saturation level overflows to the neighboring pixel portions.

Therefore, in the conventional solid-state imaging device, when one reading-out wiring is disconnected, this influences not only the pixel portions of the column connected to the reading-out wiring but also pixel portions of neighboring columns on both sides of the column in question, and eventually, defective lines occur with pixel portions of three consecutive columns. Likewise, when one row selecting wiring is disconnected, this influences not only the pixel portions of the row connected to the row selecting wiring but also pixel portions of neighboring rows on both sides of the row in question, and eventually, defective lines occur with pixel portions of three consecutive rows.

On the other hand, when defective lines are not consecutive and the neighboring lines of one defective line are normal, pixel data of the defective line can be interpolated by using pixel data of the normal neighboring lines. However, when defective lines occur with pixel portions of three consecutive rows or columns, the above-described interpolation is difficult. Particularly, in the solid-state imaging device having a large-area photodetecting section as described above, the probability of disconnection occurring is greater due to long lengths of the reading-out wiring and row selecting wiring.

There has been proposed in Patent Document 1 a technique with the intention of eliminating such drawbacks with the conventional solid-state imaging device. In this conventional technique, not only obtained is an average value of all pixel data of a neighboring line neighboring the defective line, but obtained also is an average value of all pixel data of a few further neighboring normal lines, and it is determined that the neighboring line is also defective at the time that a difference between these average values is not less than a predetermined value, the pixel data of the neighboring line is corrected, and further pixel data of the defective line is corrected based on a value after correction of the pixel data of the neighboring line.

In the technique proposed in Patent Document 1, when correcting the pixel data of the neighboring line determined to be defective, an average value of two pieces of pixel data on the nearest normal lines on both sides of the neighboring line is determined, the average value is set as pixel data of the neighboring line. Moreover, when correcting the pixel data of the defective line, an average value of two pieces of pixel data on the neighboring lines on both sides of the defective line is determined, the average value is set as pixel data of the defective line.

However, in the technique proposed in Patent Document 1, since the process of determining an average of two pieces of pixel data is to be repeated a plurality of times in order to correct pixel data of a defective line (and a line determined to be defective present in the vicinity of the defective line), an image after correction has a low resolution in the vicinity of the defective line.

There has also been proposed in Patent Document 2 a technique with the intention of eliminating the drawbacks with the conventional solid-state imaging device described above. In this conventional technique, a dummy photodiode is formed in a region between pixel portions in order to prevent a charge saturated in a pixel portion on a defective line flowing into a pixel portion on a normal neighboring line, and a charge saturated in a pixel portion on a defective line is captured by the dummy photodiode to be discharged. However, in the invention described in Patent Document 2, inflow of a charge to a pixel portion on a normal line cannot be sufficiently suppressed, and therefore, a captured image has a low resolution in the vicinity of the defective line.

The present invention has been developed to eliminate the problems described above. It is an object of the present invention to provide a solid-state imaging device having a structure that allows capturing a high-resolution image even when any reading-out wiring or any row selecting wiring is disconnected and an X-ray CT apparatus including the same.

Means for Solving the Problems

A solid-state imaging device according to the present invention comprises a photodetecting section having M (an integer not less than 2)×N (an integer not less than 2) pixel portions $P_{1,1}$ to $P_{M,N}$ two-dimensionally arrayed so as to form a matrix of M rows and N columns. In addition, each of the pixel portions $P_{1,1}$ to $P_{M,N}$ includes a photodiode generating charge of an amount according to an incident light intensity, and a reading-out switch connected to the photodiode.

Particularly, in the solid-state imaging device according to the present invention, a photodiode, included in a pixel portion $P_{m,n}$ (m is an integer not less than 1 and not more than M, n is an integer not less than 1 and not more than N) of the photodetecting section, is constituted by a first semiconductor region having a first conductivity type, and a second semiconductor region which has a second conductivity type and is formed on the first semiconductor region. Moreover, the photodetecting section has a channel stopper provided in a region sandwiched by each of the pixel portions $P_{1,1}$ to $P_{M,N}$. the channel stopper is constituted by a third semiconductor region which has the first conductivity type and a higher impurity concentration than that of the first semiconductor region. Further, the photodetecting section includes a first dummy photodiode provided in a region surrounded by any 2×2 pixel portions adjacent to one another of the pixel portions $P_{1,1}$ to $P_{M,N}$ (specifically, a corner part of any pixel portion), while being surrounded by the channel stopper. The first dummy photodiode is constituted by the common first semiconductor region and a fourth semiconductor region having the second conductivity type and is formed on the first semiconductor region. In addition, one of the first conductivity type and the second conductivity type is a p-type, and the other is an n-type.

In the solid-state imaging device according to the present invention, the photodetecting section may further include a second dummy photodiode provided in a region surrounded by any two pixel portions adjacent to one another of the pixel portions $P_{1,1}$ to $P_{M,N}$, while being surrounded by the channel stopper. In this case, the second dummy photodiode is constituted by the common first semiconductor region, and a fifth semiconductor region which has the second conductivity type and is formed on the first semiconductor region.

As described above, in the conventional solid-state imaging device, when a defective line is caused by disconnection of any reading-out wiring or any row selecting wiring, in pixel portions on the defective line, charges generated in photodiodes in response to light incidence are not reading-out, and are just accumulated in junction capacitance portions of the photodiodes. When the amount of charges accumulated in the junction capacitance portions of the photodiodes exceeds a saturation level, a surplus of charges over the saturation level overflows to the outside of the pixel portions. However, in the solid-state imaging device according to the present invention, a dummy photodiode is formed surrounded by the channel stopper in a region between the pixel portions (the periphery of a corner of each pixel portion and/or a region sandwiched by two pixel portions). Accordingly, a charge overflowed from a pixel portion on the defective line is captured by the dummy photodiode to be discharged. Consequently, the charge is suppressed from flowing into other pixel portions neighboring the pixel portion (pixel portion from which the charge has overflowed) on the defective line, so that a degradation in the S/N ratio is suppressed. Therefore, the solid-state imaging device according to the present invention can capture a high-resolution image even when any reading-out wiring or any row selecting wiring is disconnected.

Each pixel portion generally occupies a substantially square region. Most of the substantially square region is a region of the photodiode, and a field-effect transistor serving as the reading-out switch is formed in one corner of the substantially square region. In the corners of the substantially square region of the photodiode, because of high field intensity, a charge is likely to overflow. Moreover, in the vicinity of a region where the reading-out switch is provided, an unnecessary charge is likely to be generated. Therefore, in the present invention, a dummy photodiode is formed in at least a region surrounded by any 2×2 pixel portions adjacent to one another of the M×N pixel portions $P_{1,1}$ to $P_{M,N}$ (a common corner part of each of the pixel portions), and thus a charge generated in the corner of the substantially square region of the photodiode can be effectively discharged by the dummy photodiode.

Moreover, an X-ray CT apparatus according to the present invention comprises an X-ray output section, a solid-state imaging device having a structure as described above (solid-state imaging device according to the present invention), moving means, and an image analyzing section. The X-ray output section outputs X-rays toward a subject. The solid-state imaging device receives and images X-rays having been outputted from the X-ray output section and reached through the subject. The moving means moves the X-ray output section and the solid-state imaging device relative to the subject. The image analyzing section inputs frame data to be outputted from the solid-state imaging device, and generates a tomographic image of the subject based on the frame data.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the scope of the invention will be apparent to those skilled in the art from this detailed description.

Effects of the Invention

In accordance with the solid-state imaging device and the like according to the present invention, a high-resolution image can be captured even when any of the row selecting wiring is disconnected.

DESCRIPTION OF THE REFERENCE NUMERALS

Figure 1:
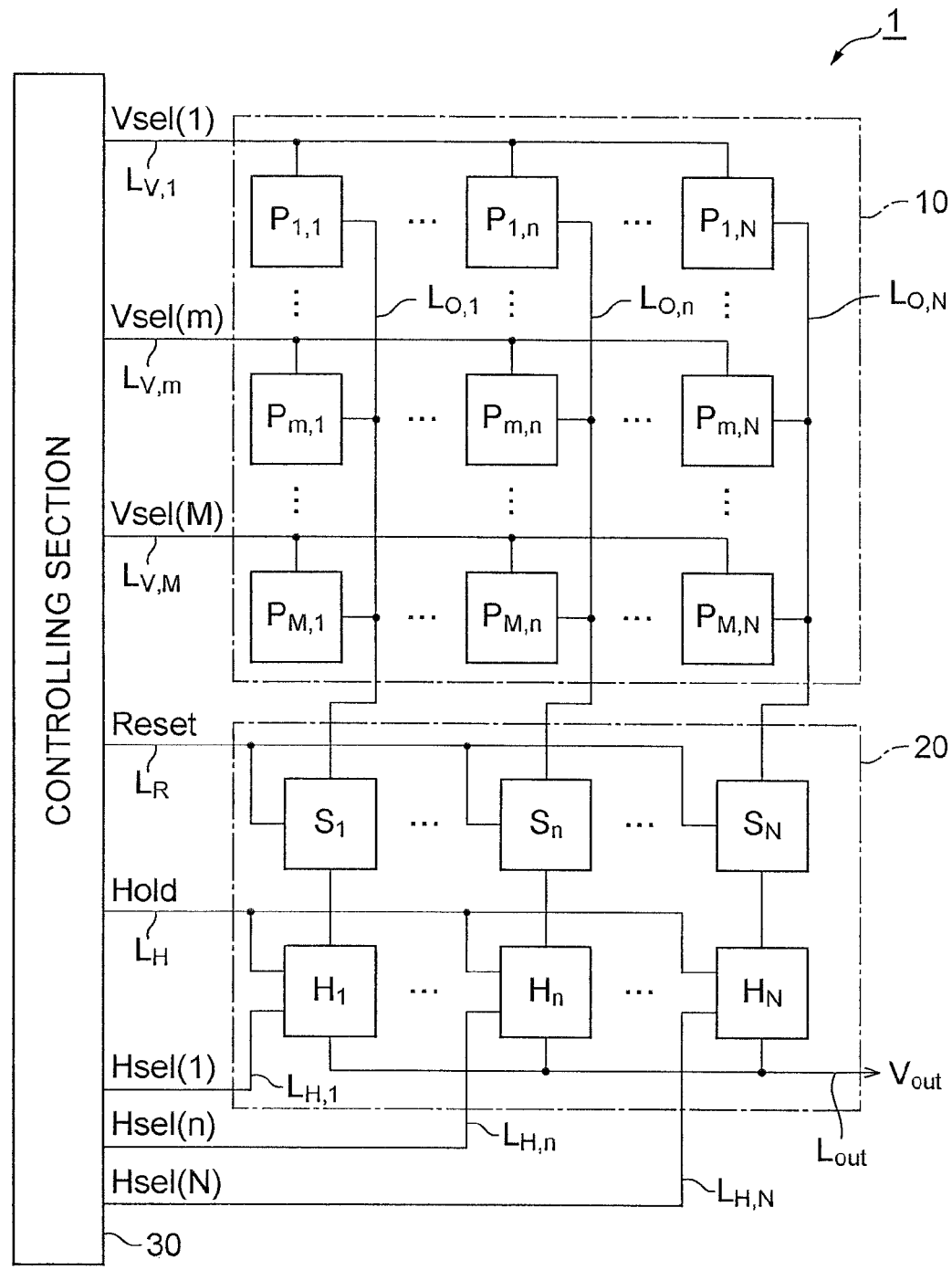
FIG. 1 is a view showing a configuration of an embodiment of a solid-state imaging device according to the present invention.

1 . . . solid-state imaging device; 10, 10A, 10B . . . photodetecting section, 20; 20A, 20B . . . signal reading-out section; 30 . . . controlling section; 201 . . . p-type semiconductor region; 202 . . . n$^+$-type semiconductor region; 203 . . . depletion layer; 204 . . . p$^+$-type semiconductor region; 205 . . . insulating layer; 206 . . . contact hole; 207 . . . metal wiring; 212 . . . n$^+$-type semiconductor region; 213 . . . depletion layer; 216 . . . contact hole; $P_{1,1}$ to $P_{M,N}$ . . . pixel portion; PD . . . photodiode; $SW_1$ . . . reading-out switch; $S_1$ to $S_N$ . . . integrating circuit; $C_2$ . . . integrating capacitive element; $SW_2$ . . . discharge switch; $A_2$ . . . amplifier; $H_1$ to $H_N$ . . . holding circuit; $C_3$ . . . holding capacitive element; $SW_{31}$ . . . input switch; $SW_{32}$ . . . output switch; $L_{V,m}$ . . . m-th row selecting wiring; $L_{H,n}$ . . . n-th column selecting wiring; $L_{O,n}$ . . . n-th column reading-out wiring; $L_R$ . . . discharge controlling wiring; $L_H$ . . . hold controlling wiring; $L_{out}$ . . . voltage output wiring; CS . . . channel stopper; and PD1, PD2 . . . dummy photodiode.

BEST MODES FOR CARRYING OUT THE INVENTION

In the following, embodiments of a solid-state imaging device and an X-ray CT apparatus according to the present invention will be explained in detail with reference to FIGS. 1 to 8. In the description of the drawings, identical or corresponding components are designated by the same reference numerals, and overlapping description is omitted.

FIG. 1 is a view showing a configuration of an embodiment of a solid-state imaging device according to the present invention. The solid-state imaging device 1 shown in FIG. 1 comprises a photodetecting section 10, a signal reading-out section 20, and a controlling section 30. Moreover, in the case of usage as an X-ray flat panel sensor, a scintillator panel is overlaid on the photodetecting surface 10 of the solid-state imaging device 1.

The photodetecting section 10 includes M×N pixel portions $P_{1,1}$ to $P_{M,N}$ two-dimensionally arrayed in a matrix of M rows and N columns. In the photodetecting section 10, a pixel portion $P_{m,n}$ is a pixel portion located on the m-th row and the n-th column. Here, M and N are integers not less than 2, respectively, and m is an integer not less than 1 and not more than M, and n is an integer not less than 1 and not more than N. The pixel portions $P_{m,n}$ in the photodetecting sections 10 are pixel portions of the PPS type, and have a common configuration.

Each of the N pixel portions $P_{m,1}$ to $P_{m,N}$ belonging to the m-th row is connected to the controlling section 30 via an m-th row selecting wiring $L_{V,m}$. Each output terminal of the M pixel portions $P_{1,n}$ to $P_{M,n}$ belonging to the n-th column is connected to an integrating circuit $S_n$ included in the signal reading-out section 20 via an n-th column reading-out wiring $L_{O,n}$.

The signal reading-out section 20 includes N integrating circuits $S_1$ to $S_N$ and N holding circuits $H_1$ to $H_N$. The integrating circuits $S_n$ have a common configuration. Moreover, the holding circuits $H_n$, have a common configuration.

Each integrating circuit $S_n$, has an input terminal connected to the reading-out wiring $L_{O,n}$. Each integrating circuit $S_n$ accumulates charges inputted via the input terminal, and outputs a voltage value according to the accumulated charge amount from an output terminal to the holding circuit $H_n$. Each of the N integrating circuits $S_1$ to $S_N$ is connected to the controlling section 30 via a discharge controlling wiring $L_R$.

Each holding circuit $H_n$ has an input terminal connected to the output terminal of the integrating circuit $S_n$. Each holding circuit $H_n$, holds a voltage value inputted via the input terminal, and outputs the held voltage value from an output terminal to an output wiring $L_{out}$. Each of the N holding circuits $H_1$ to $H_N$ is connected to the controlling section 30 via a hold controlling wiring $L_H$. Moreover, each holding circuit $H_n$ is connected to the controlling section 30 via an n-th column selecting wiring $L_{H,n}$.

The controlling section 30 outputs an m-th row selecting controlling signal Vsel(m) to the m-th row selecting wiring $L_{V,m}$ to supply this m-th row selecting controlling signal Vsel(m) to each of the N pixel portions $P_{m,1}$ to $P_{m,N}$ of the m-th row. M row selecting controlling signals Vsel(1) to Vsel(M) sequentially take significant values. The controlling section 30 includes a shift register to sequentially output M row selecting controlling signals Vsel(1) to Vsel(M) as significant values.

The controlling section 30 outputs an n-th column selecting controlling signal Hsel(n) to the n-th row selecting wiring $L_{H,n}$ to supply this n-th column selecting controlling signal Hsel(n) to the holding circuit $H_n$. N column selecting controlling signals Hsel(1) to Hsel(N) also sequentially take significant values. The controlling section 30 includes a shift register to sequentially output N column selecting controlling signals Hsel(1) to Hsel(N) as significant values.

Moreover, the controlling section 30 outputs a discharge controlling signal Reset to the discharge controlling wiring $L_R$ to supply the discharge controlling signal Reset to each of the N integrating circuits $S_1$ to $S_N$. The controlling section 30 outputs a hold controlling signal Hold to the hold controlling wiring $L_H$ to supply this hold controlling signal Hold to each of the N holding circuits $H_1$ to $H_N$.

The controlling section 30, as in the above, controls an opening and closing operation of a reading-out switch $SW_1$ included in each of the N pixel portions $P_{m,1}$ to $P_{m,N}$ belonging to the m-th row in the photodetecting section 10, and controls a holding operation and an output operation of a voltage value in the signal reading-out section 20. Accordingly, the controlling section 30 makes a voltage value according to the amount of charge generated in the photodiode PD included in each of the M×N pixel portions $P_{1,1}$ to $P_{M,N}$ in the photodetecting section 10 be repeatedly outputted as frame data from the signal reading-out section 20.

Figure 2:
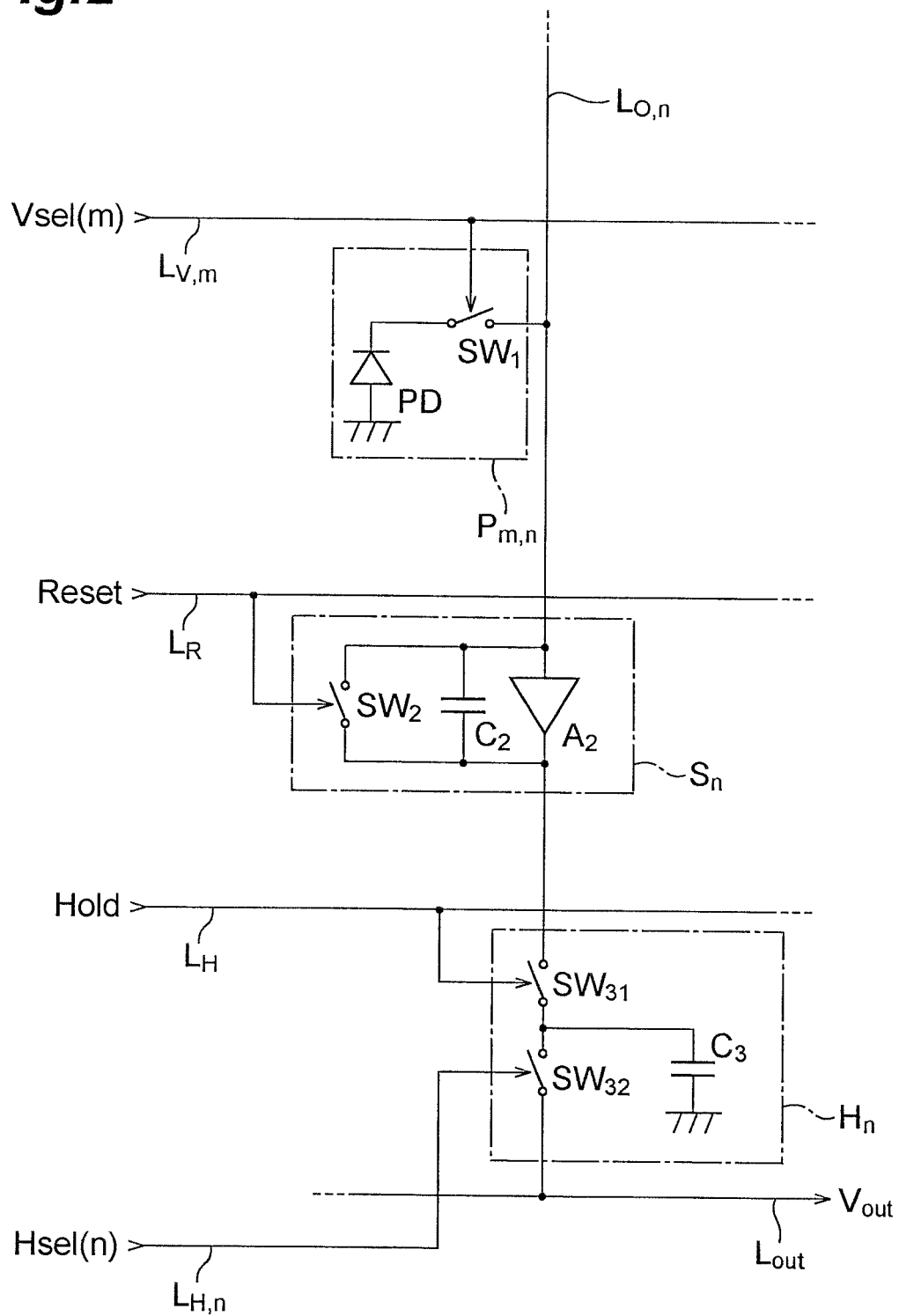
FIG. 2 is a circuit diagram of each of the pixel portion $P_{m,n}$, the integrating circuit $S_n$, and the holding circuit $H_n$ included in the solid-state imaging device 1 shown in FIG. 1.

FIG. 2 is a circuit diagram of each of the pixel portion $P_{m,n}$, the integrating circuit $S_n$, and the holding circuit $H_n$ included in the solid-state imaging device shown in FIG. 1. Here, a circuit diagram of the pixel portion $P_{m,n}$ as a representative of the M×N pixel portions $P_{1,1}$ to $P_{M,N}$ is shown, a circuit diagram of the integrating circuit $S_n$ as a representative of the N integrating circuits $S_1$ to $S_N$ is shown, and a circuit diagram of the holding circuit $H_n$ as a representative of the N holding circuits $H_1$ to $H_N$ is shown. That is, in FIG. 2, circuit portions relating to the pixel portion $P_{m,n}$ on the m-th row and the n-th column and the n-th column reading-out wiring $L_{O,n}$ are shown.

The pixel portion $P_{m,n}$ includes a photodiode PD and a reading-out switch $SW_1$. The anode terminal of the photodiode PD is grounded, and the cathode terminal of the photodiode PD is connected to the n-th column reading-out wiring $L_{O,n}$ via the reading-out switch $SW_1$. The photodiode PD generates charge of an amount according to an incident light intensity, and accumulates the generated charge in a junction capacitance portion. The reading-out switch $SW_1$ is supplied with an m-th row selecting controlling signal through the m-th row selecting wiring $L_{V,m}$ from the controlling section 30. The m-th row selecting controlling signal is an electrical signal that instructs an opening and closing operation of the reading-out switch $SW_1$ included in each of the N pixel portions $P_{m,1}$ to $P_{m,N}$ belonging to the m-th row in the photodetecting section 10.

In this pixel portion $P_{m,n}$, when the m-th row selecting controlling signal Vsel(m) is at low level, the reading-out switch $SW_1$ opens. At this time, a charge generated in the photodiode PD is not outputted to the n-th column reading-out wiring $L_{O,n}$ but is accumulated in the junction capacitance portion. On the other hand, when the m-th row selecting controlling signal Vsel(m) is at high level, the reading-out switch $SW_1$ closes. At this time, the charge generated in the photodiode PD and accumulated in the junction capacitance portion until then is outputted to the n-th column reading-out wiring $L_{O,n}$ through the reading-out switch $SW_1$.

The n-th column reading-out wiring $L_{O,n}$ is connected to the reading-out switch $SW_1$ included in each of the M pixel portions $P_{1,n}$ to $P_{M,n}$ belonging to the n-th column in the photodetecting section 10. The n-th column reading-out wiring $L_{O,n}$ reads out a charge generated in the photodiode PD included in any one of the M pixel portions $P_{1,n}$ to $P_{M,n}$ via the reading-out switch $SW_1$ included in the pixel portion and transfers the charge to the integrating circuit $S_n$.

The integrating circuit $S_n$ includes an amplifier $A_2$, an integrating capacitive element $C_2$, and a discharge switch $SW_2$. The integrating capacitive element $C_2$ and the discharge switch $SW_2$ are connected in parallel to each other, and provided between an input terminal and an output terminal of the amplifier $A_2$. The input terminal of the amplifier $A_2$ is connected to the n-th column reading-out wiring $L_{O,n}$. The discharge switch $SW_2$ is supplied with a discharge controlling signal Reset through the discharge controlling wiring $L_R$ from the controlling section 30. The discharge controlling signal Reset is an electrical signal that instructs an opening and closing operation of the discharge switch $SW_2$ included in the N integrating circuits $S_1$ to $S_N$.

In this integrating circuit $S_n$, when the discharge controlling signal Reset is at high level, the discharge switch $SW_2$ closes. Accordingly, the integrating capacitive element $C_2$ is discharged, and a voltage value to be outputted from the integrating circuit $S_n$ is initialized. When the discharge controlling signal Reset is at low level, the discharge switch $SW_2$ opens. Then, a charge inputted to the input terminal is accumulated in the integrating capacitive element $C_2$, and a voltage value according to the accumulated charge amount is outputted from the integrating circuit $S_n$.

The holding circuit $H_n$ includes an input switch $SW_{31}$, an output switch $SW_{32}$, and a holding capacitive element $C_3$. One end of the holding capacitive element $C_3$ is grounded. The other end of the holding capacitive element $C_3$ is connected to the output terminal of the integrating circuit $S_n$ via the input switch $SW_{31}$, and connected to the voltage output wiring $L_{out}$ via the output switch $SW_{32}$. The input switch $SW_{31}$ is supplied with a hold controlling signal Hold through the hold controlling wiring $L_H$ from the controlling section 30. The hold controlling signal Hold is an electrical signal that instructs an opening and closing operation of the input switch $SW_{31}$ included in each of the N holding circuits $H_1$ to $H_N$. The output switch $SW_{32}$ is supplied with an n-th column selecting controlling signal Hsel(n) through the n-th column selecting wiring $L_{H,n}$ from the controlling section 30. The n-th column selecting controlling signal Hsel(n) is an electrical signal that instructs an opening and closing operation of the output switch $SW_{32}$ included in the holding circuit $H_n$.

In this holding circuit $H_n$, when the hold controlling signal Hold switches from high level to low level, the input switch $SW_{31}$ switches from a closed state to an open state. At this time, a voltage value being inputted to the input terminal is held in the holding capacitive element $C_3$. When the n-th column selecting controlling signal Hsel(n) is at high level, the output switch $SW_{32}$ closes. Then, the voltage value held in the holding capacitive element $C_3$ is outputted to the voltage output wiring $L_{out}$.

When outputting a voltage value according to a received light intensity in each of the N pixel portions $P_{m,1}$ to $P_{m,N}$ belonging to the m-th row in the photodetecting section 10, the controlling section 30 instructs temporary closing and then opening of the discharge switch $SW_2$ included in each of the N integrating circuits $S_1$ to $S_N$ by a discharge controlling signal Reset. The controlling section 30 then instructs closing of the reading-out switch $SW_1$ included in each of the N pixel portions $P_{m,1}$ to $P_{m,N}$ belonging to the m-th row in the photodetecting section 10 for a predetermined period by an m-th row selecting controlling signal Vsel(m). The controlling section 30, in the predetermined period, instructs switching of the input switch $SW_{31}$ included in each of the N holding circuits $H_1$ to $H_N$ from a closed state to an open state by a hold controlling signal Hold. Then, the controlling section 30, after the predetermined period, instructs sequential closing of the output switches $SW_{32}$ included in the N holding circuits $H_1$ to $H_N$ for a predetermined period by column selecting controlling signals Hsel(1) to Hsel(N). The controlling section 30 performs the control for the respective rows in sequence.

Next, operation of an embodiment (FIG. 1) of a solid-state imaging device according to the present invention will be described. In the solid-state imaging device 1, as a result of level changes of each of the M row selecting controlling signals Vsel(1) to Vsel(M), the N column selecting controlling signals Hsel(1) to Hsel(N), the discharge controlling signal Reset, and the hold controlling signal Hold at predetermined timings under control by the controlling section 30, light made incident on the photodetecting surface 10 can be imaged to obtain frame data.

Figure 3:
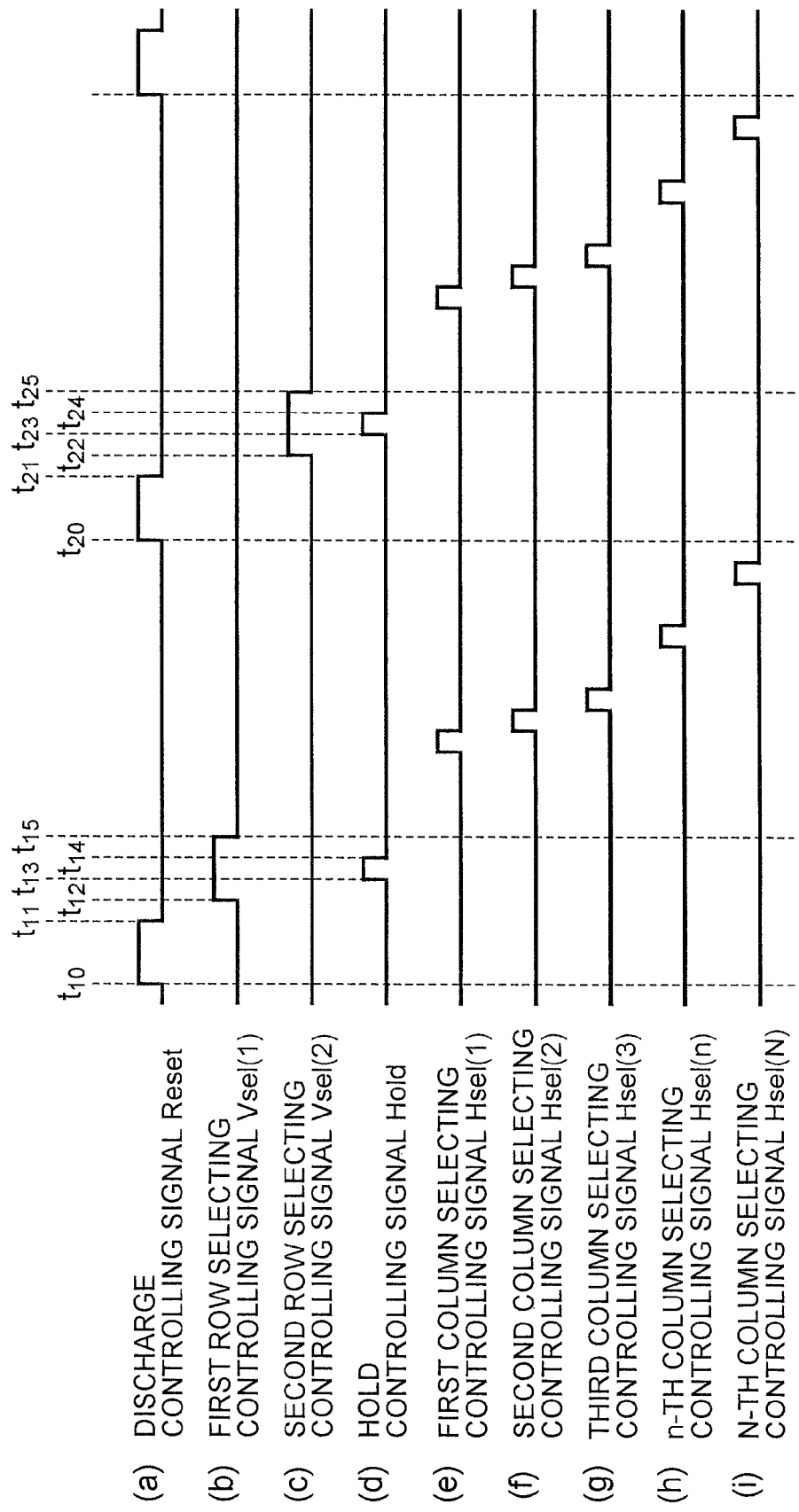
FIG. 3 is a timing chart for explaining operation of the solid-state imaging device shown in FIG. 1.

FIG. 3 is a timing chart for explaining operation of the solid-state imaging device 1. FIG. 3 shows (a) the discharge controlling signal Reset for instructing an opening and closing operation of the discharge switch $SW_2$ included in each of the N integrating circuits $S_1$ to $S_N$, (b) the first row selecting controlling signal Vsel(1) for instructing an opening and closing operation of the reading-out switch $SW_1$ included in each of the N pixel portions $P_{1,1}$ to $P_{1,N}$ of the first row in the photodetecting section 10, (c) the second row selecting controlling signal Vsel(2) for instructing an opening and closing operation of the reading-out switch $SW_1$ included in each of the N pixel portions $P_{2,1}$ to $P_{2,N}$ of the second row in the photodetecting section 10, and (d) the hold controlling signal Hold for instructing an opening and closing operation of the input switch $SW_{31}$ included in each of the N holding circuits $H_1$ to $H_N$.

FIG. 3 further shows (e) the first column selecting controlling signal Hsel(1) for instructing an opening and closing operation of the output switch $SW_{32}$ included in the holding circuit $H_1$, (f) the second column selecting controlling signal Hsel(2) for instructing an opening and closing operation of the output switch $SW_{32}$ included in the holding circuit $H_2$, (g) the third column selecting controlling signal Hsel(3) for instructing an opening and closing operation of the output switch $SW_{32}$ included in the holding circuit $H_3$, (h) the n-th column selecting controlling signal Hsel(n) for instructing an opening and closing operation of the output switch $SW_{32}$ included in the holding circuit $H_n$, and (i) the N-th column selecting controlling signal Hsel(N) for instructing an opening and closing operation of the output switch $SW_{32}$ included in the holding circuit $H_N$.

A charge generated in the photodiode PD included in each of the N pixel portions $P_{1,1}$ to $P_{1,N}$ belonging to the first row and accumulated in the junction capacitance portion is reading-out as follows.

That is, before the time $t_{10}$, the M row selecting controlling signals Vsel(1) to Vsel(M), the N column selecting controlling signals Hsel(1) to Hsel(N), the discharge controlling signal Reset, and the hold controlling signal Hold are at low level. During a period from the time $t_{10}$ to $t_{11}$, the discharge controlling signal Reset to be outputted from the controlling section 30 to the discharge controlling wiring $L_R$ becomes high level. Accordingly, in each of the N integrating circuits $S_1$ to $S_N$, the discharge switch $SW_2$ closes. At this time, the integrating capacitive element $C_2$ is discharged. Moreover, during a period from the time $t_{12}$ to the time $t_{15}$ after the time $t_{11}$, the first row selecting controlling signal Vsel(1) to be outputted from the controlling section 30 to the first row selecting wiring $L_{V,1}$ becomes high level. Accordingly, the reading-out switch $SW_1$ included in each of the N pixel portions $P_{1,1}$ to $P_{1,N}$ belonging to the first row in the photodetecting section 10 closes.

In the period ($t_{12}$ to $t_{15}$), during a period from the time $t_{13}$ to the time $t_{14}$, the hold controlling signal Hold to be outputted from the controlling section 30 to the hold controlling wiring $L_H$ becomes high level. Accordingly, the input switch $SW_{31}$ closes in each of the N holding circuits $H_1$ to $H_N$.

In the period ($t_{12}$ to $t_{15}$), the reading-out switch $SW_1$ included in each pixel portion $P_{1,n}$ belonging to the first row is closed, but the discharge switch $SW_2$ of each integrating circuit $S_n$ is open. Therefore, a charge generated in the photodiode PD of each pixel portion $P_{1,n}$ and accumulated in the junction capacitance portion until then is transferred to (accumulated in) the integrating capacitive element $C_2$ of the integrating circuit $S_n$ through the reading-out switch $SW_1$ of the pixel portion $P_{1,n}$ and the n-th column reading-out wiring $L_{O,n}$. Then, a voltage value according to the amount of charge accumulated in the integrating capacitive element $C_2$ of each integrating circuit $S_n$ is outputted from the output terminal of the integrating circuit $S_n$.

At the time $t_{14}$ in the period ($t_{12}$ to $t_{15}$), when the hold controlling signal Hold switches from high level to low level, in each of the N holding circuits $H_1$ to $H_N$, the input switch $SW_{31}$ switches from a closed state to an open state. At this time, a voltage value being outputted from the output terminal of the integrating circuit $S_n$ and being inputted to the input terminal of the holding circuit $H_n$ is held in the holding capacitive element $C_3$.

Then, after the period ($t_{12}$ to $t_{15}$), column selecting controlling signals Hsel(1) to Hsel(N) to be outputted from the controlling section 30 to the column selecting wirings $L_{H,1}$ to $L_{H,N}$ sequentially become high level for a predetermined period. Accordingly, the output switches $SW_{32}$ included in the N holding circuits $H_1$ to $H_N$ sequentially close for the predetermined period. Accordingly, the voltage values held in the holding capacitive elements $C_3$ of the holding circuits $H_n$ are sequentially outputted to the voltage output wiring $L_{out}$ through the output switches $SW_{32}$. The voltage value $V_{out}$ to be outputted to the voltage output wiring $L_{out}$ indicates the received light intensity in the photodiode PD included in each of the N pixel portions $P_{1,1}$ to $P_{1,N}$ of the first row.

Subsequently, a charge generated in the photodiode PD included in each of the N pixel portions $P_{2,1}$ to $P_{2,N}$ belonging to the second row and accumulated in the junction capacitance portion is reading-out as follows.

During a period from the time $t_{20}$ to the time $t_{21}$, the discharge controlling signal Reset to be outputted from the controlling section 30 to the discharge controlling wiring $L_R$ becomes high level. Accordingly, in each of the N integrating circuits $S_1$ to $S_N$, the discharge switch $SW_2$ closes. As a result, the integrating capacitive element $C_2$ is discharged. Moreover, during a period from the time $t_{22}$ to the time $t_{25}$ after the time $t_{21}$, the second row selecting controlling signal Vsel(2) to be outputted from the controlling section 30 to the second row selecting wiring $L_{V,2}$ becomes high level. Accordingly, the reading-out switch $SW_1$ included in each of the N pixel portions $P_{2,1}$ to $P_{2,N}$ belonging to the second row in the photodetecting section 10 closes.

In the period ($t_{22}$ to $t_{25}$), during a period from the time $t_{23}$ to the time $t_{24}$, the hold controlling signal Hold to be outputted from the controlling section 30 to the hold controlling wiring $L_H$ becomes high level. Accordingly, input switch $SW_{31}$ closes in each of the N holding circuits $H_1$ to $H_N$.

Then, after the period ($t_{22}$ to $t_{25}$), column selecting controlling signals Hsel(1) to Hsel(N) to be outputted from the controlling section 30 to the column selecting wirings $L_{H,1}$ to $L_{H,N}$ sequentially become high level for a predetermined period. Accordingly, the output switches $SW_{32}$ included in the N holding circuits $H_1$ to $H_N$ sequentially close for the predetermined period.

Thus, a voltage value $V_{out}$ indicating the received light intensity in the photodiode PD included in each of the N pixel portions $P_{2,1}$ to $P_{2,N}$ belonging to the second row is outputted to the voltage output wiring $L_{out}$.

Subsequent to the operation for the first and the second rows as in the above, the same operation is performed for the third to the M-th rows. As a result, frame data indicating an image captured in one time of imaging is obtained. When the operation is completed for the M-th row, the same operation is again performed in order from the first row, and frame data indicating a next image is obtained. By thus repeating the same operation with a predetermined period, voltage values $V_{out}$ indicating a two-dimensional intensity distribution of an image of light received by the photodetecting section 10 are outputted to the voltage output wiring $L_{out}$. Frame data is obtained by repetition of this output.

Meanwhile, in the period during which the reading-out switch $SW_1$ included in each of the N pixel portions $P_{m,1}$ to $P_{m,N}$ belonging to the m-th row is closed, a charge generated in the photodiode PD of each pixel portion $P_{m,n}$ belonging to the m-th row and accumulated in the junction capacitance portion is transferred to the integrating capacitive element $C_2$ of the integrating circuit $S_n$ through the reading-out switch $SW_1$ of the pixel portion $P_{m,n}$ and the n-th column reading-out wiring $L_{O,n}$. At this time, the accumulated charge in the junction capacitance portion of the photodiode PD of each pixel portion $P_{m,n}$ belonging to the m-th row is initialized.

However, when a certain n-th column reading-out wiring $L_{O,n}$ is disconnected at a point halfway, among the M pixel portions $P_{1,n}$ to $P_{M,n}$ belonging to the n-th column, pixel portions located farther from the integrating circuit $S_n$ than the disconnected point are not connected to the integrating circuit $S_n$, and cannot transfer charges to the integrating circuit $S_n$. Therefore, initialization of the accumulated charges in the junction capacitance portions of the photodiodes PD by this charge transfer is impossible. If this goes on, charges generated in the photodiodes in response to light incidence in these pixel portions are just accumulated in the junction capacitance portions of the photodiodes. In the condition that the charges exceed the saturation level, they overflow to pixel portions belonging to neighboring columns and cause defective lines in pixel portions of the three consecutive columns.

Moreover, likewise, when a certain m-th row selecting wiring $L_{V,m}$ is disconnected at a point halfway, among the N pixel portions $P_{m,1}$ to $P_{m,N}$ belonging to the m-th row, pixel portions located farther from the control circuit 30 than the disconnected point are not transmitted with an m-th row selecting controlling signal Vsel(m) from the controlling section 30. In this case, the reading-out switches $SW_1$ remain open, so that charges cannot be transferred to the integrating circuit $S_n$. Therefore, initialization of the accumulated charges in the junction capacitance portions of the photodiodes PD by this charge transfer is impossible. If this goes on, charges generated in the photodiodes in response to light incidence in these pixel portions are just accumulated in the junction capacitance portions of the photodiodes. In the condition that the charges exceed the saturation level, they overflow to pixel portions belonging to neighboring rows and cause defective lines in pixel portions of the three consecutive rows.

In order to cope with the problems described above, the solid-state imaging device 1 (an embodiment of a solid-state imaging device according to the present invention) shown in FIG. 1 operates as to be described in the following with reference to FIG. 4 to FIG. 7. That is, in the solid-state imaging device 1, the photodetecting section 10 includes a dummy photodiode PD1 (first dummy photodiode) provided, in a region surrounded by any 2×2 pixel portions adjacent to one another of the M×N pixel portions $P_{1,1}$ to $P_{M,N}$ (a common corner part of each pixel portion), surrounded by a channel stopper CS.

Figure 4:
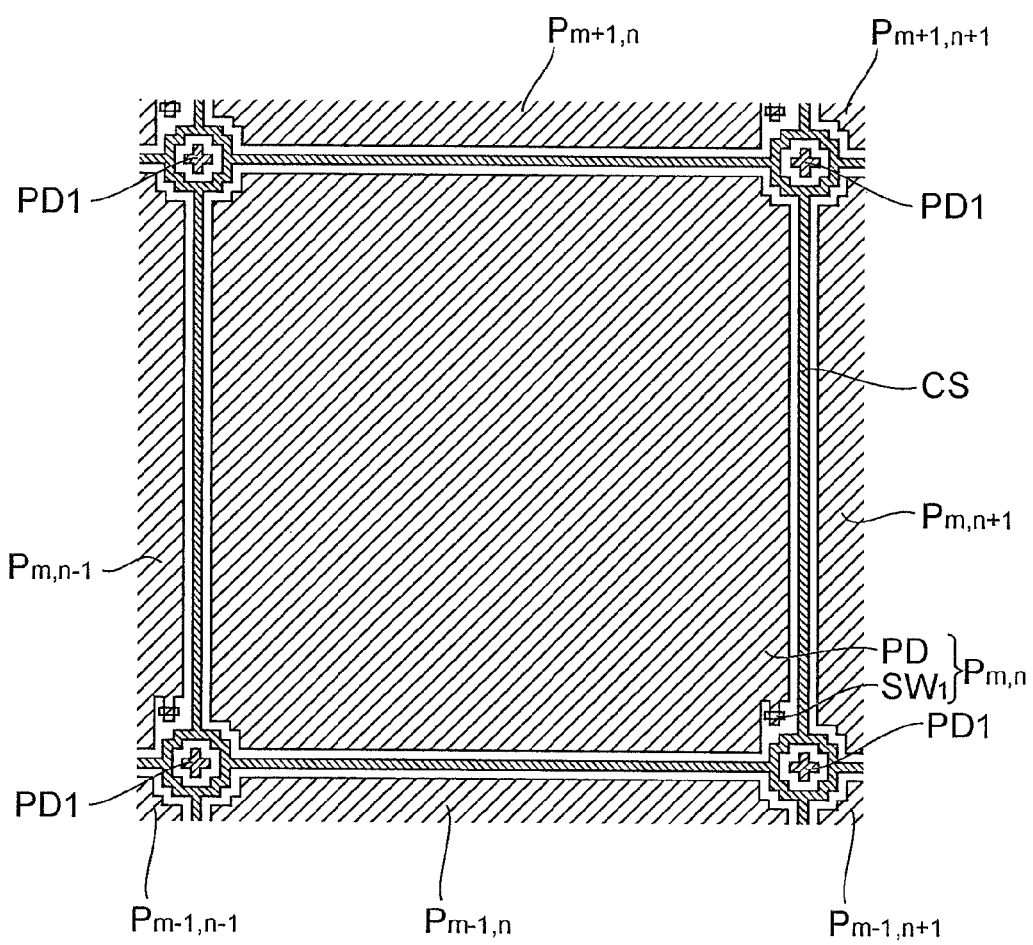
FIG. 4 is a plan view showing a configuration example of a photodetecting section in the solid-state imaging device shown in FIG. 1.
Figure 5:
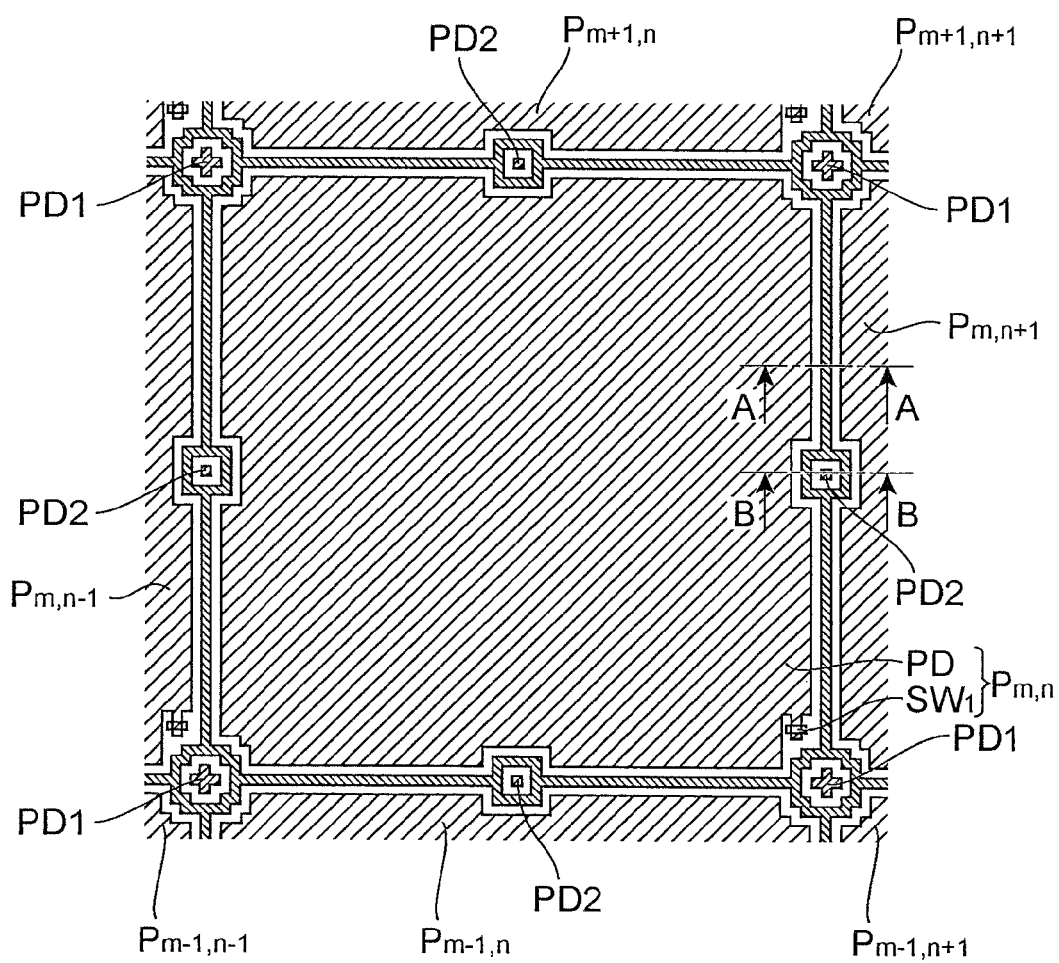
FIG. 5 is a plan view showing another configuration example of a photodetecting section in the solid-state imaging device shown in FIG. 1.

FIG. 4 and FIG. 5 each show a configuration example (plan view) of the photodetecting section 10 in the solid-state imaging device 1. In FIG. 4 and FIG. 5, around one pixel portion $P_{m,n}$ in the photodetecting section 10, parts of neighboring pixel portions of the pixel portion $P_{m,n}$ are also shown. Moreover, in FIG. 4 and FIG. 5, a layout of a semiconductor region is mainly shown, but metal wirings (row selecting wiring, reading-out wiring) and an insulating layer present on the semiconductor region are not shown.

In the layout example shown in each of FIG. 4 and FIG. 5, the pixel portion $P_{m,n}$ occupies a substantially square region. Most of the substantially square region is a region of the photodiode PD, and a field-effect transistor serving as the reading-out switch $SW_1$ is formed in one corner of the substantially square region. A source terminal of the field-effect transistor serving as the reading-out switch $SW_1$ of the pixel portion $P_{m,n}$ is connected to the cathode terminal of the photodiode PD, a drain terminal of the field-effect transistor is connected to the reading-out wiring $L_{O,n}$, and a gate terminal of the field-effect transistor is connected to the row selecting wiring $L_{V,m}$.

In the layout example shown in each of FIG. 4 and FIG. 5, a channel stopper CS is continuously formed in a region between the pixel portions. Moreover, in the region surrounded by any 2×2 pixel portions adjacent to one another, a dummy photodiode PD1 is formed. This dummy photodiode PD1 is surrounded by the channel stopper CS.

In the layout example shown in FIG. 4, only in the region surrounded by any 2×2 pixel portions adjacent to one another, the dummy photodiode PD1 is formed. In the layout example shown in FIG. 5, not only formed in the region surrounded by any 2×2 pixel portions adjacent to one another is a dummy photodiode PD1, but formed also in a region sandwiched by any two pixel portions adjacent to one another is a dummy photodiode PD2.

Figure 6:
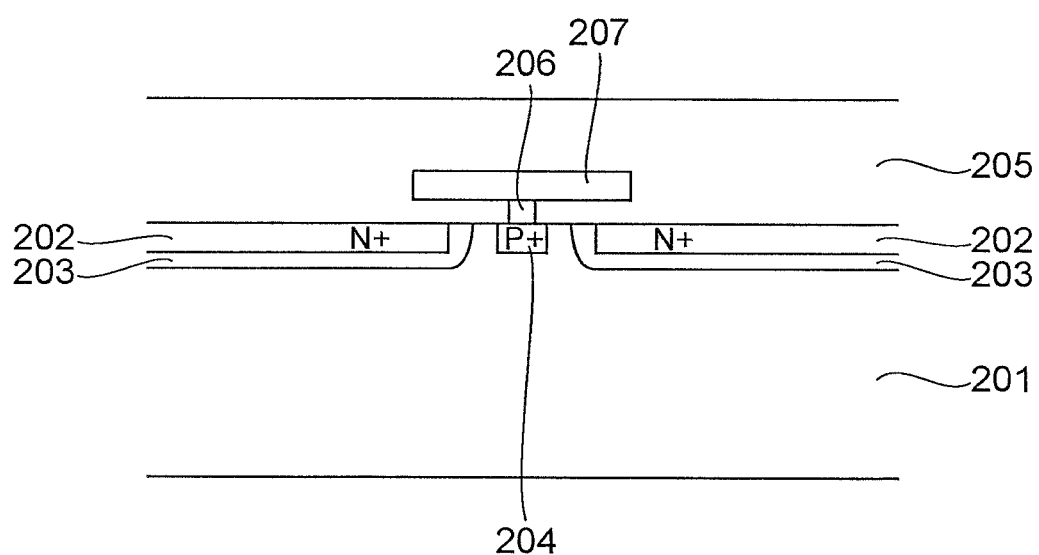
FIG. 6 is a sectional view of a region located between pixel portions along a line A-A in FIG. 5.
Figure 7:
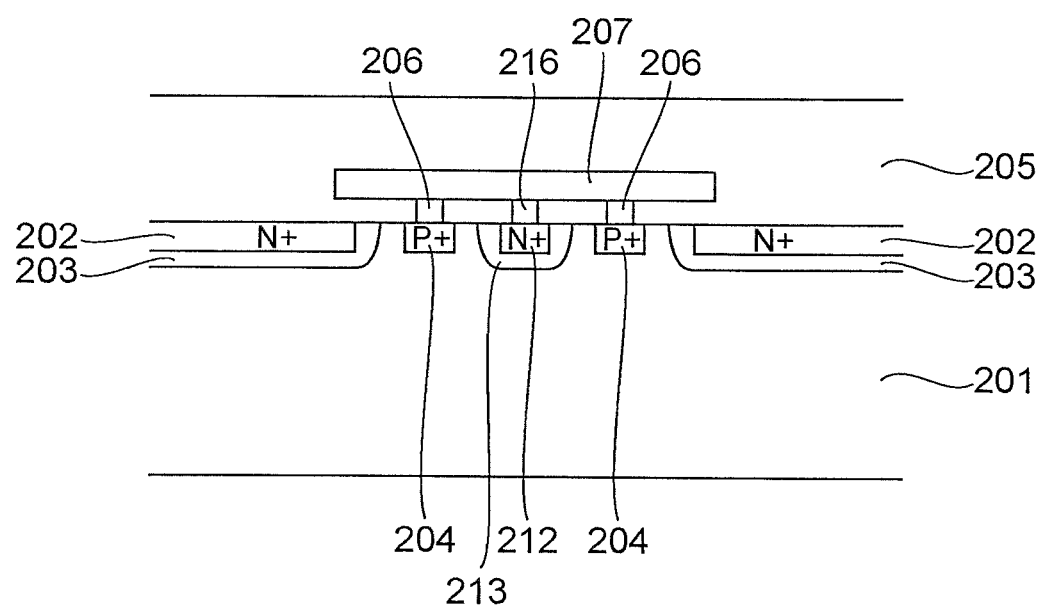
FIG. 7 is a sectional view of a region located between pixel portions along a line B-B in FIG. 5.

FIG. 6 is a sectional view of a peripheral region of the pixel portion $P_{m,n}$ along a line A-A in FIG. 5. FIG. 7 is a sectional view of a peripheral region of the pixel portion $P_{m,n}$ along a line B-B in FIG. 5. FIG. 6 and FIG. 7 each show a section of parts of neighboring pixel portions on both sides of a region between the pixel portions. FIG. 6 shows a section of a region where the dummy photodiode PD1, PD2 is not formed. FIG. 7 shows a section of a part where the dummy photodiode PD2 is formed.

A semiconductor region 201 is a semiconductor region doped with a p-type impurity, and includes a substrate and an epitaxial layer formed on the substrate. The photodiode PD included in the pixel portion $P_{m,n}$ consists of the p-type semiconductor region 201 and an $n^+$-type semiconductor region 202 provided on the p-type semiconductor region 201. In a region including a boundary between the p-type semiconductor region 201 and the $n^+$-type semiconductor region 202, a depletion layer 203 is formed. In a region between the pixel portions (region between the $n^+$-type semiconductor regions 202), a channel stopper CS formed of a $p^+$-type semiconductor region 204 with a higher p-type impurity concentration than that of the p-type semiconductor region 201 is formed. This $p^+$-type semiconductor region 204 is connected to a metal wiring 207 via a contact hole 206 formed in an insulating layer 205.

The dummy photodiodes PD1, PD2 each being constituted by the p-type semiconductor region 201 and an $n^+$-type semiconductor region 212 provided on the p-type semiconductor region 201. In a region including a boundary between the p-type semiconductor region 201 and the $n^+$-type semiconductor region 212, a depletion layer 213 is formed. This $n^+$-type semiconductor region 212 is connected to a metal wiring 207 via a contact hole 216 formed in an insulating layer 205. Moreover, the n$^+$-type semiconductor region 212 is surrounded by a p$^+$-type semiconductor region 204, and thus the dummy photodiodes PD1, PD2 are each surrounded by the channel stopper CS.

As an example, the semiconductor region 201 including the substrate has a thickness of 750 µm. The n$^+$-type semiconductor region 202, the p$^+$-type semiconductor region 204, and the n$^+$-type semiconductor region 212 each have a thickness of 1 µm. The p$^+$-type semiconductor region 204 and the n$^+$-type semiconductor region 212 each have a width of 1.4 µm. In the part (FIG. 6) where the dummy photodiode PD2 is not formed, an interval between the two adjacent n$^+$-type semiconductor regions 202 is 3.6 µm, and the metal wiring 207 has a width of 4.8 µm. In the part (FIG. 7) where the dummy photodiode PD2 is formed, an interval between the n$^+$-type semiconductor region 202 and the n$^+$-type semiconductor region 212 is 3.6 µm, and the metal wiring 207 has a width of 9.8 µm.

As described above, when any reading-out wiring or any row selecting wiring is disconnected, in pixel portions not connected to the signal reading-out section 20 or the controlling section 30 because of this disconnection, charges generated in photodiodes in response to light incidence are not reading-out to the integrating circuit, and are just accumulated in junction capacitance portions of the photodiodes. When the amount of charges accumulated in the junction capacitance portions of the photodiodes exceeds a saturation level, a surplus of charges over the saturation level overflows to the outside of the pixel portions.

However, in the solid-state imaging device 1 (an embodiment of a solid-state imaging device according to the present invention) having a structure as above, a dummy photodiode PD1, PD2 is formed in a region between the pixel portions, while being surrounded by the channel stopper CS. Inevitably, a charge overflowed from a pixel portion is captured by the dummy photodiode PD1, PD2 to be discharged. Accordingly, in the solid-state imaging device 1, a charge is suppressed from flowing into pixel portions neighboring the pixel portion, so that degradation of the S/N ratio is suppressed. Therefore, according to the solid-state imaging device 1, a high-resolution image can be captured even when any reading-out wiring or any row selecting wiring is disconnected.

Moreover, when any reading-out wiring or any row selecting wiring is disconnected to cause a defective line, voltage values corresponding to pixel portions on the defective line of the frame data can be determined based on voltage values corresponding to pixel portions on a normal neighboring line. When making this determination, it is preferable to make a determination by interpolation based on voltage values corresponding to pixel portions on neighboring lines on both sides.

The dummy photodiode PD1, PD2 intends to discharge charges overflowed from the pixel portions, and does not intend to actively collect so-called crosstalk carriers. Therefore, it is not preferable that the depletion layer 213 excessively spreads when no disconnection has occurred. This is because, when the solid-state imaging device 1 is used in combination with a scintillator panel as an X-ray flat panel sensor, scintillator light is isotropically generated from the scintillator panel. As a result, a certain degree of charge is generated also in a region between the pixel portions, but if this charge is discharged by the dummy photodiode PD1, PD2, the output can be small. Therefore, the dummy photodiodes PD1, PD2 are not provided so as to extend continuously in a region between the pixel portions, but are provided discretely (in dots). Moreover, the dummy photodiodes PD1, PD2 are all surrounded by the channel stopper CS. This configuration allows realizing a fine balance between suppressing a decline in output and suppressing the degradation of the S/N ratio.

As described above, the pixel portion $P_{m,n}$ occupies a substantially square region, and most of the substantially square region is a region of the photodiode PD, and a field-effect transistor serving as the reading-out switch $SW_1$ is formed in one corner of the substantially square region. In the corners of the substantially square region of the photodiode PD, because of high field intensity, a charge is likely to overflow. Moreover, in the vicinity of a region where the reading-out switch $SW_1$ is provided, an unnecessary charge is likely to be generated. Therefore, in the solid-state imaging device 1, a dummy photodiode PD1 is formed in a region surrounded by any 2×2 pixel portions adjacent to one another of the M×N pixel portions $P_{1,1}$ to $P_{M,N}$ (a common corner part of each pixel portion). Thus, a charge generated in the corner of the substantially square region of the photodiode PD can be effectively discharged by the dummy photodiode PD1.

As compared with the layout shown in FIG. 5, in the layout shown in FIG. 4, the dummy photodiode PD2 is not provided in a region sandwiched by two adjacent pixel portions. Since only the dummy photodiode PD1 is provided in a region surrounded by 2×2 adjacent pixel portions, the photodiode PD of each pixel portion can have a large photoresponsive region, so that the aperture ratio can be increased.

Next, the solid-state imaging device 1 having a structure as described above is suitably used for an X-ray CT apparatus. Therefore, an embodiment of an X-ray CT apparatus (X-ray CT apparatus according to the present invention) comprising the solid-state imaging device 1 (an embodiment of a solid-state imaging device according to the present invention) will be described in the following.

Figure 8:
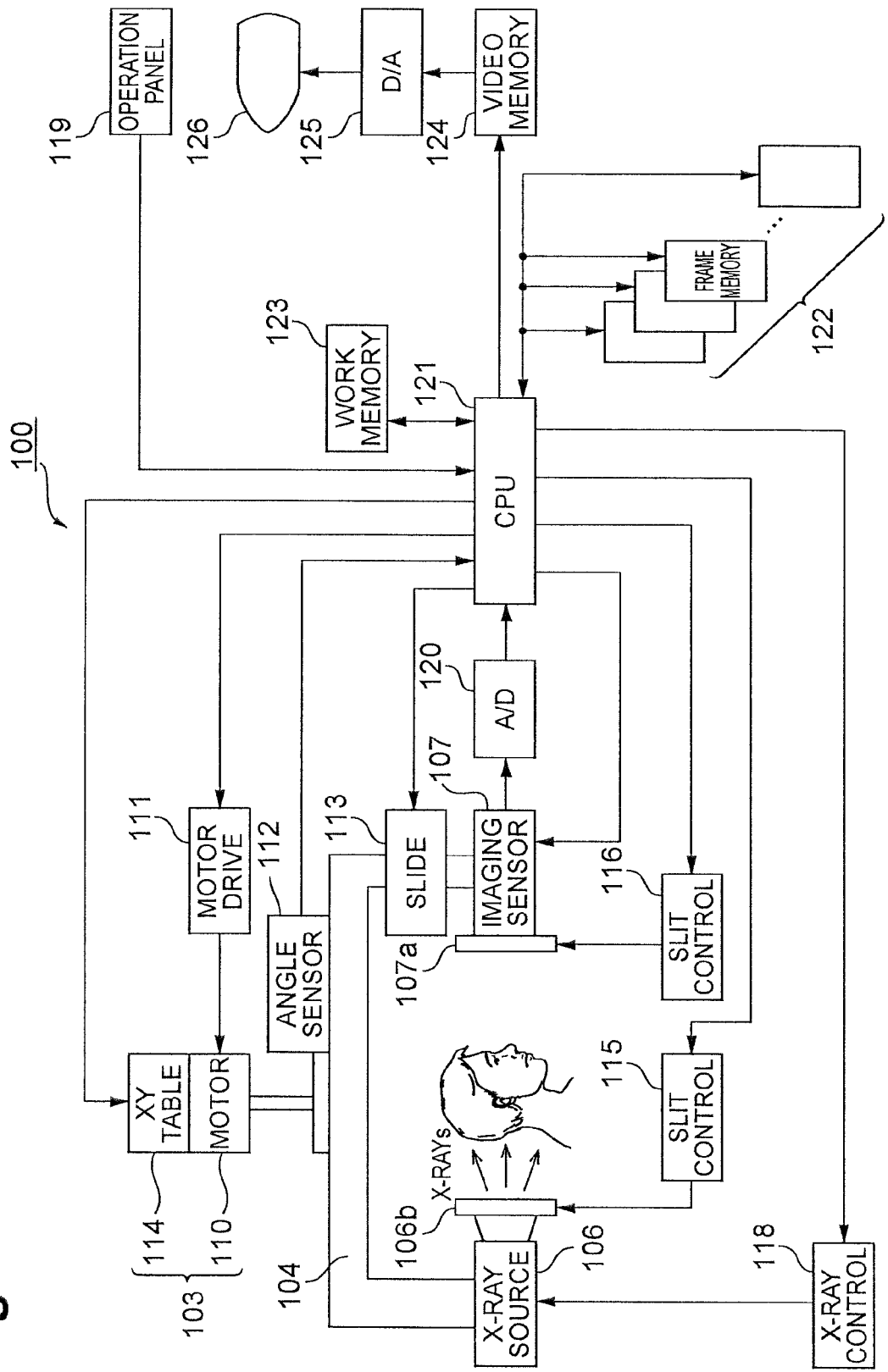
FIG. 8 is a view showing a configuration of an embodiment of an X-ray CT apparatus according to the present invention.

FIG. 8 is a view showing a configuration of an embodiment of an X-ray CT apparatus according to the present invention. In the X-ray CT apparatus shown in FIG. 8, an X-ray source 106 generates X-rays toward a subject. The radiation field of X-rays generated from the X-ray source 106 is controlled by a primary slit plate 106b. The X-ray source 106 has an X-ray tube built therein, and by adjusting conditions of the X-ray tube, such as a tube voltage, a tube current, and energization time, the X-ray dose to the subject is controlled. An X-ray imaging sensor 107 has a built-in CMOS solid-state imaging device having a plurality of pixel portions arrayed two-dimensionally, and detects an X-ray image transmitted through the subject. In front of the X-ray imaging sensor 107, a secondary slit plate 107a that limits an X-ray incident region is provided.

While holding the X-ray source 106 and the X-ray imaging sensor 107 so as to be opposed, a swing arm 104 swings these around the subject in panoramic tomography. Moreover, in the case of linear tomography, a sliding mechanism 113 for linearly displacing the X-ray imaging sensor 107 with respect to the subject is provided. The swing arm 104 is driven by an arm motor 110 that forms a rotary table, and a rotation angle thereof is detected by an angle sensor 112. Moreover, the arm motor 110 is mounted on a movable portion of an XY table 114, and the center of rotation is arbitrarily adjusted in a horizontal plane.

Image signals outputted from the X-ray imaging sensor 107 are converted to 10-bit (=1024 level) digital data by an AD converter 120, and once taken in a CPU (Central Processing Unit) 121. Thereafter, the converted digital data is stored in a frame memory 122. From the image data stored in the frame memory 122, a tomographic image along any tomographic plane is reproduced by a predetermined arithmetic processing. The reproduced tomographic image is outputted to a video memory 124, and converted to analog signals by a DA converter 125, and then displayed by an image display section 126 such as a CRT (cathode ray tube), and provided for various diagnoses.

The CPU 121 is connected with a work memory 123 required for signal processing, and further connected with an operation panel 119 having a panel switch, an X-ray irradiation switch, etc. Moreover, the CPU 121 is connected to a motor drive circuit 111 that drives the arm motor 110, slit control circuits 115, 116 that control the opening range of the primary slit plate 106b and the secondary slit plate 107a, an X-ray control circuit 118 that controls the X-ray source 106, respectively, and further outputs a clock signal to drive the X-ray imaging sensor 107.

The X-ray control circuit 118 is capable of feedback-controlling the X-ray dose to the subject based on signals imaged by the X-ray imaging sensor 107.

In the X-ray CT apparatus 100 configured as above, the X-ray imaging sensor 107 is equivalent to the photodetecting section 10, the signal reading-out section 20, and the controlling section 30 in the above-mentioned solid-state imaging device 1, and a scintillator panel is provided at the front of the photodetecting section 10.

As a result of comprising the above-described solid-state imaging device 1, the X-ray CT apparatus 100 can capture a high-resolution tomographic image even in the vicinity of a defective line. Particularly, in the X-ray CT apparatus, a large number of (for example, 300) frames of data are successively obtained in a short period, and the amount of incident light into the photodetecting section 10 in the solid-state imaging device 1 varies frame by frame. Moreover, the amount of charges overflowing from pixel portions on a defective line to pixel portions on neighboring lines varies frame by frame. As a result of such an X-ray CT apparatus comprising the solid-state imaging device 1 having a structure as described above, the X-ray CT apparatus can capture a high-resolution image even when any reading-out wiring or any row selecting wiring is disconnected.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

The invention claimed is:

1. A solid-state imaging device which comprises a photodetecting section having M×N pixel portions $P_{1,1}$ to $P_{M,N}$ two-dimensionally arrayed so as to form a matrix of M rows and N columns, each of the pixel portions $P_{1,1}$ to $P_{M,N}$ including a photodiode that generates charge of an amount according to an incident light intensity, and a reading-out switch connected to the photodiode, each of the M and N being an integer not less than 2, wherein the photodiode, included in a pixel portion $P_{m,n}$ of the photodetecting section, is constituted by a first semiconductor region having a first conductivity type, and a second semiconductor region which has a second conductivity type and is formed on the first semiconductor region, the m being an integer not less than 1 and not more than M, the n being an integer not less than 1 and not more than N, wherein the photodetecting section has a channel stopper provided in a region sandwiched by each of the pixel portions $P_{1,1}$ to $P_{M,N}$, the channel stopper being constituted by a third semiconductor region which has the first conductivity type and a higher impurity concentration than that of the first semiconductor region, and wherein the photodetecting section includes plural first dummy photodiodes arranged around one pixel portion without completely surrounding the one pixel portion, the each first dummy photodiode provided in a region surrounded by any 2×2 pixel portions adjacent to one another of the pixel portions $P_{1,1}$ to $P_{M,N}$, while being surrounded by the channel stopper, the each first dummy photodiode being constituted by the first semiconductor region, and a fourth semiconductor region which has the second conductivity type and is formed on the first semiconductor region.

2. A solid-state imaging device according to claim 1, wherein the photodetecting section further includes plural second dummy photodiodes arranged around the one pixel portion, the each second dummy photodiode provided between the first dummy photodiodes adjacent to one another and in a region surrounded by any two pixel portions adjacent to one another of the pixel portions $P_{1,1}$ to $P_{M,N}$, while being surrounded by the channel stopper, the each second dummy photodiode being constituted by the first semiconductor region, and a fifth semiconductor region which has the second conductivity type and is formed on the first semiconductor region.

3. An X-ray CT apparatus, comprising:
an X-ray output section outputting X-rays toward a subject;
a solid-state imaging device according to claim 1 which receives and images X-rays having been outputted from the X-ray output section and reached through the subject;
moving means for moving the X-ray output section and the solid-state imaging device relative to the subject; and
an image analyzing section inputting frame data to be outputted from the solid-state imaging device, and generating a tomographic image of the subject based on the frame data.

* * * * *

UNITED STATES PATENT AND TRADEMARK OFFICE
CERTIFICATE OF CORRECTION

PATENT NO. : 8,488,735 B2  Page 1 of 1
APPLICATION NO. : 12/864575
DATED : July 16, 2013
INVENTOR(S) : Fujita et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 242 days.

Signed and Sealed this
Eighth Day of September, 2015

Michelle K. Lee
*Director of the United States Patent and Trademark Office*